United States Patent [19]
Jan et al.

[11] Patent Number: 5,998,846
[45] Date of Patent: Dec. 7, 1999

[54] LAYOUT STRUCTURE OF MULTI-USE COUPLING CAPACITORS IN REDUCING GROUND BOUNCES AND REPLACING FAULTY LOGIC COMPONENTS

[75] Inventors: Tzong-Shi Jan; Yen-Tai Lin, both of Hsinchu, Taiwan

[73] Assignee: Vanguard International Semiconductor Corporation, Taiwan

[21] Appl. No.: 09/050,621

[22] Filed: Mar. 30, 1998

[51] Int. Cl.$^6$ .................................................. H01L 29/72
[52] U.S. Cl. .......................... 257/401; 257/296; 257/379; 257/390; 257/532; 257/773
[58] Field of Search .................................... 257/296, 379, 257/390, 401, 532, 773

[56] References Cited

U.S. PATENT DOCUMENTS

5,883,423  5/1999  Patwa et al. ............................. 257/731

*Primary Examiner*—Edward Wojciechowicz
*Attorney, Agent, or Firm*—Christensen O'Connor Johnson & Kindness PLLC

[57] ABSTRACT

A first mask includes a well mask formed over a first portion of the wafer to define a first conductive type well in the wafer. A first polysilicon mask is formed over the well mask including a plurality of first structures and a plurality of second structures to cover a first polysilicon layer, thereby defining polysilicon gates. A first implanting mask is formed over the first polysilicon mask for forming second conductive type region. A second implanting mask is formed over the first polysilicon mask for forming first conductive type region. A second polysilicon mask is formed between gates of a second conductive type MOS and gates of a first conductive type MOS. A contact hole mask is formed over the second polysilicon mask for forming contact holes. A metal mask is formed over the contact hole mask for forming connection.

7 Claims, 11 Drawing Sheets

LAYOUT STRUCTURE OF MULTI-USE COUPLING CAPACITORS IN REDUCING GROUND BOUNCES AND REPLACING FAULTY LOGIC COMPONENTS

FIELD OF THE INVENTION

The present invention relates generally to semiconductor devices, and more specifically, to a layout for multiple use of decoupling capacitors residing on a semiconductor die.

BACKGROUND OF THE INVENTION

The challenge to pact a greater density of electronic components on a semiconductor die has frequently caused faulty logic components, such as an inverter, a PMOS transistor, a NMOS transistor, a NAND gate, or other type of basic logic components to falter. A faulty logic component on a semiconductor die, without means to rectify the fault, renders integrated circuits to be unusable. Several different approaches have been used to replace these faulty components on a semiconductor die to repair the faulty logic components and permits the circuit to resume to normal operations.

One conventional approach is to use redundant components on a semiconductor die in which each of the redundant components is available to replace a faulty component. However, this solution could be costly because there are several different logic components and to manufacture redundant components for every type of logic components can be prohibitly expensive and cumbersome. A typical use of a redundant circuit occurs in placing redundant memory, not the redundant logic circuit, on a semiconductor die.

Advance in the formation of a semiconductor integrated circuits has primarily been directed towards the increase in the density of devices on an integrated circuit. The size of various devices must be precisely determined and their exact positions on the substrate established. In order to construct semiconductor devices with small and exact features, photolithography processes with high resolution capabilities must be available. The elements of the integrated circuits, from the active region of transistor to metal connections, have to be precisely connected to perform some desired functions. The layout of an integrated circuits provides such function available.

A die is typically and primly divided into a device area and a periphery circuit area. The devices or memory cells are formed in the device area of the die, circuits and some electrical connections are manufactured in the periphery circuit area. In addition, the dummy decoupling capacitors are manufactured in any unused area on the die which leave spaces available to imprint dummy decoupling capacitors on the die. These dummy decoupling capacitors can be used to replace or alter the logic functions of the integrated circuit by reconstruct the electrical connections between the integrated circuits and the decoupling capacitors. However, the conventional method for performing the aforesaid function of the dummy decoupling capacitor needs at least three masks, such as metal 1, metal 2 or visa to construct decoupling capacitors.

Accordingly, there is a need to provide a structure on a semiconductor die which has a multi-use in replacing the various types of faulty components.

SUMMARY OF THE INVENTION

The present invention overcomes the foregoing limitations by incorporating dummy decouplings capacitors on a semiconductor die where the dummy decoupling capacitors are placed in a layout structure to provide multiple-use of the dummy decoupling capacitors. These dummy decoupling capacitors can be used to replace a fault inverter. The metal layer between the first polysilicon layer stripe structures is removed. The portions of the metal layer formed between the gate and either the p type guard ring or n type guard ring are also removed. The polysilicon layer defined by the first stripe structures is connected to the second polysilicon layer defined by the second polysilicon mask by using contact holes. Portions of the first polysilicon layer are utilized to serve the input terminal of the inverter. A portion of the metal layer on the N well defined by the second stripe structures can be used as the output terminal of the inverter. The metal layer between the gates defined by the first and second stripe structures are removed, then a PMOS and a NMOS are generated by separating the gates.

Another embodiment of the present invention serves as a 3-input NAND gate. The structures are the same with the embodiments disclosed above except for the metal mask. Metal lines are defined by the metal line mask. The metal line first portion connects to the n type guard ring, p type impurity region, a portion of the gate on the N well as defined by the first stripe structures, and as defined by the second stripe structures. The metal line second portion connects the p type guard ring, n type impurity region, a portion of the gate on the p conductive type region as defined by the first stripe, and as defined by the second stripe structures. Portions of the gates defined by the second stripe structures are connected to the gates defined by the first stripe structures using metal line third portion. Portions of the gates defined by the first stripe structures are connected to the gates defined by the second stripe structures using forth metal line portion. The metal line fifth portion is used to connect the gates defined by the second stripe structures and the gates defined by the second stripe structures. This portion serves as the output terminal of the NAND gate. The metal line first portion defined by the metal mask is connected to the Vcc. The metal line second portion defined by the metal mask is connected to ground. Portions of the gates are utilized to activate the first input terminal, the second input terminal and the third input terminal of the NAND gate, respectively.

A N well mask defines a N well region in a wafer. A portion of a polysilicon mask is formed over the N well mask and a P conductive type region. The polysilicon mask is used to define a plurality of polisilicon gates formed on the N well and on the P conductive type region, respectively. The polysilicon mask includes a plurality of first stripe structures and a plurality of second stripe structures. A portion of the first stripe structures is formed over the N well to define the gate of a PMOS transistor. Others are formed over the P conductive type region for defining the gate of a NMOS transistor.

A first implanting mask for forming p type impurity region includes two portions. The first portion of the first implanting mask exposes the area on the N well adjacent to the polysilicon gate. A p type impurity region of the PMOS can be generated by using the first implanting mask. The second portion of the first implanting mask exposes the area that surrounds the gate of the NMOS transistor to form a p type guard ring for the NMOS transistor. Alternatively, a second implanting mask for forming n type impurity region also includes two portions. The first portion of the second implanting mask exposes the area on the P conductive type region adjacent to the polysilicon gate. The second portion exposes the area that surrounds of the gate of the PMOS transistor for forming PMOS's n type guard ring.

A second polysilicon mask includes a plurality of stripe structures for defining a second polysilicon layer that is formed between the gate of PMOS and the gate of NMOS. A contact hole mask formed over the second polysilicon mask exposes portions of the first and second polysiicon layer, p type impurity region, the n type impurity region, the n type guard ring and the p type guard ring for forming contact holes. A metal mask is formed over the contact hole mask to define the metal line for electrical connection. A first metal mask portion defines the metal layer connecting to the n type guard ring, p type impurity region, the gate on the N well and the gate on the p type impurity region. A second metal mask portion define the metal layer to connect the p type guard ring, n type impurity region, the gate on the p type impurity region and the gate on the N well. Third portion metal mask portions define the metal line to connect the p type guard ring and n type guard ring. The metal layer defined by the first metal mask portion is connected to the Vcc, while the metal layer defined by the second metal mask portion is connected to ground.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method and a structure are disclosed to provide a layout of dummy decoupling capacitors. In the normal operation mode, each of the dummy decoupling capacitors is connected to a location in the integratedcircuits on a die to reduce the power and ground bounce phenomenon to the overall circuit functions. These dummy decoupling capacitors can be used to replace or alter the logic functions of the integrated circuit by reconstruct the electrical connections between the integrated circuits and the decoupling capacitors. For example, during the design and testing of an integrated circuits, if a functional fault occurs which requires an additional inverter to be coupled to an input signal to further delay the input signal for the data to be latched onto an enable signal, then a dummy capacitor can serve as that additional inverter to provide further delay to the integrated circuits. In order to perform the function to replace fault devices, it only needs one mask to alter the metal layer. Specifically, the layout structure can provide MULTI-use by altering the layer of the metal using one mask. For example, the decoupling capacitor can be used to replace the PMOS, NMOS and the inverter.

Figure 1A:
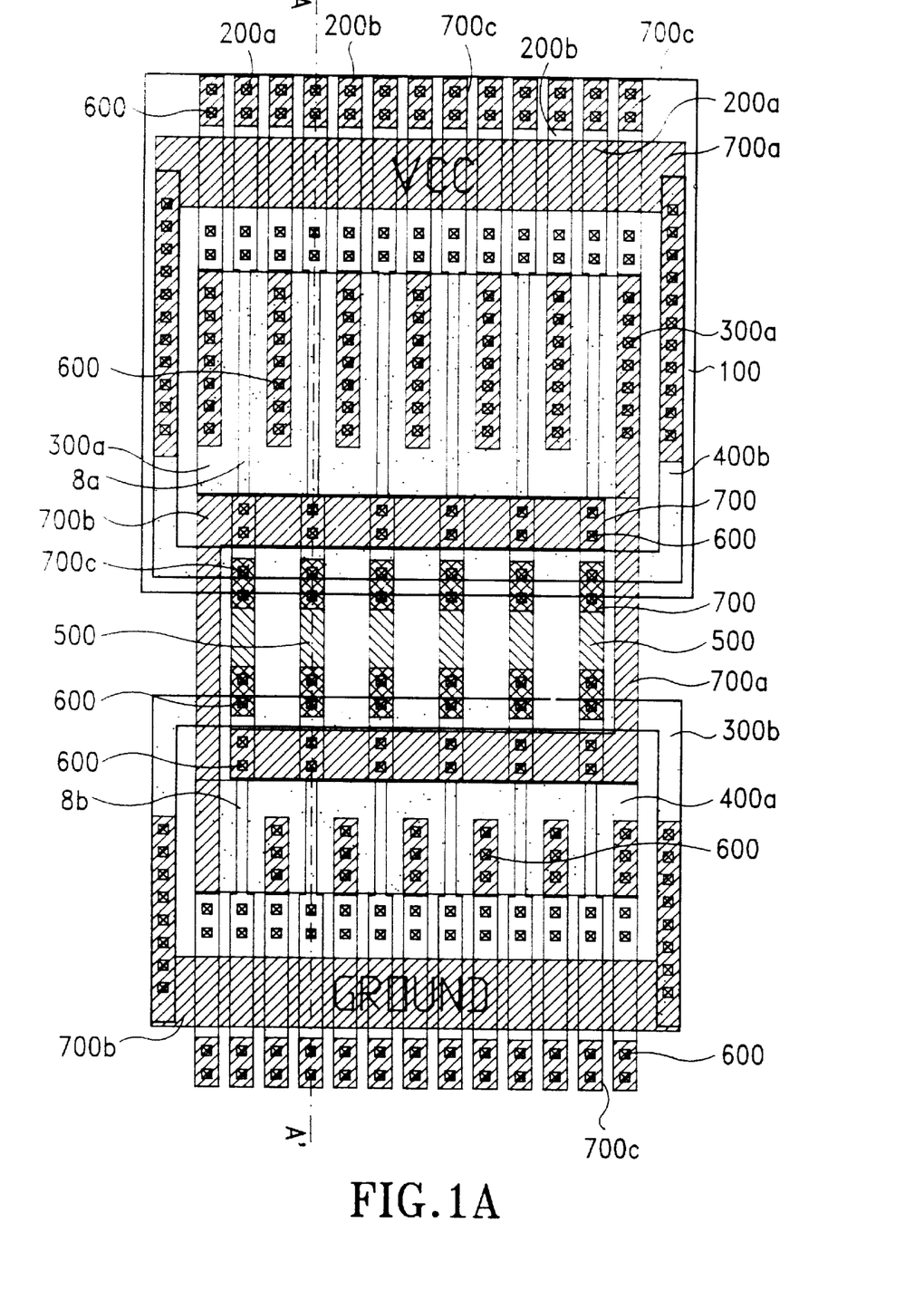
FIG. 1A is a schematic drawing illustrating the layout of a first embodiment in accordance with the present invention.
Figure 1B:
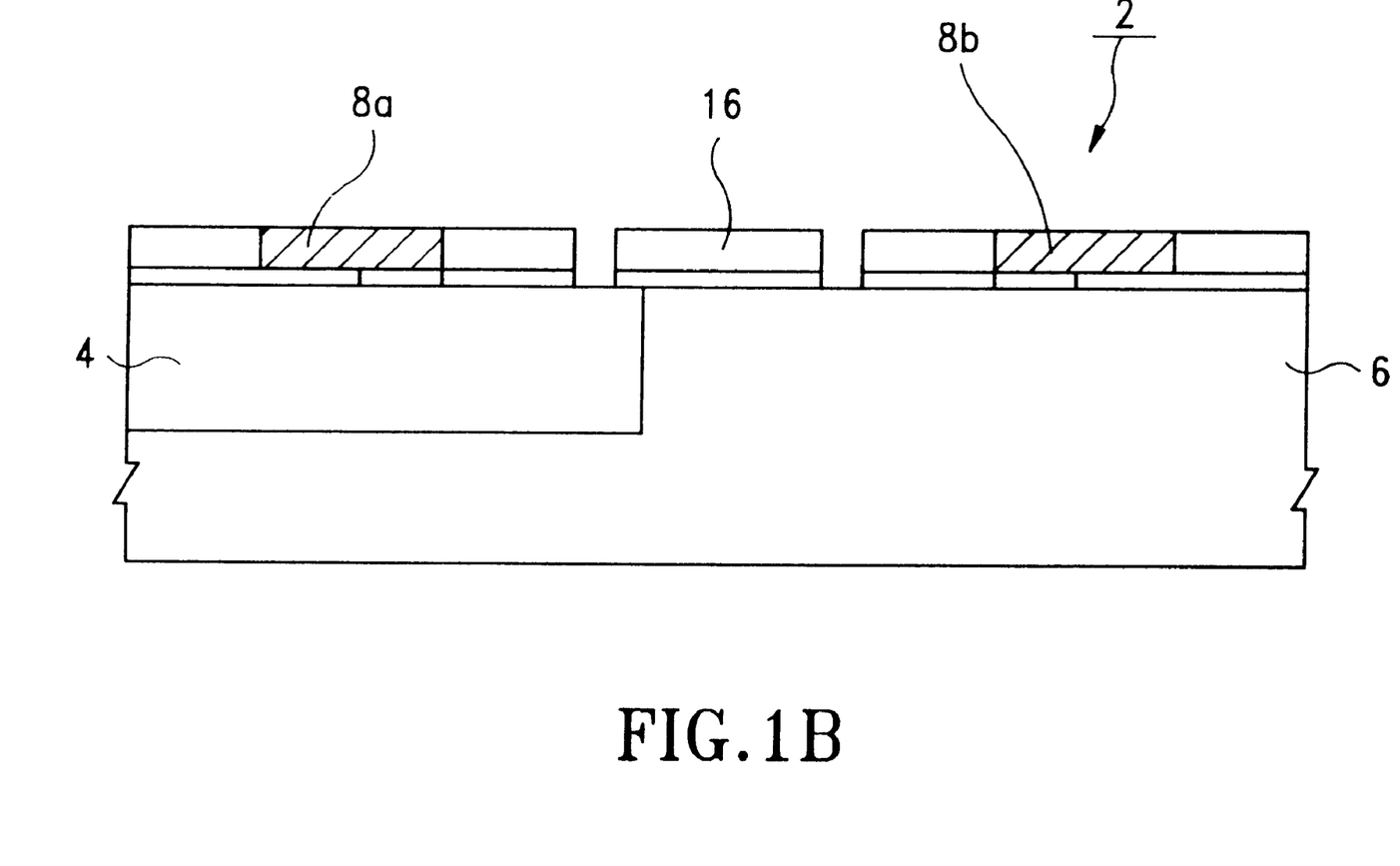
FIG. 1B is a cross section drawing taken from A–A' line of FIG. 1A in accordance with present invention.
Figure 5:
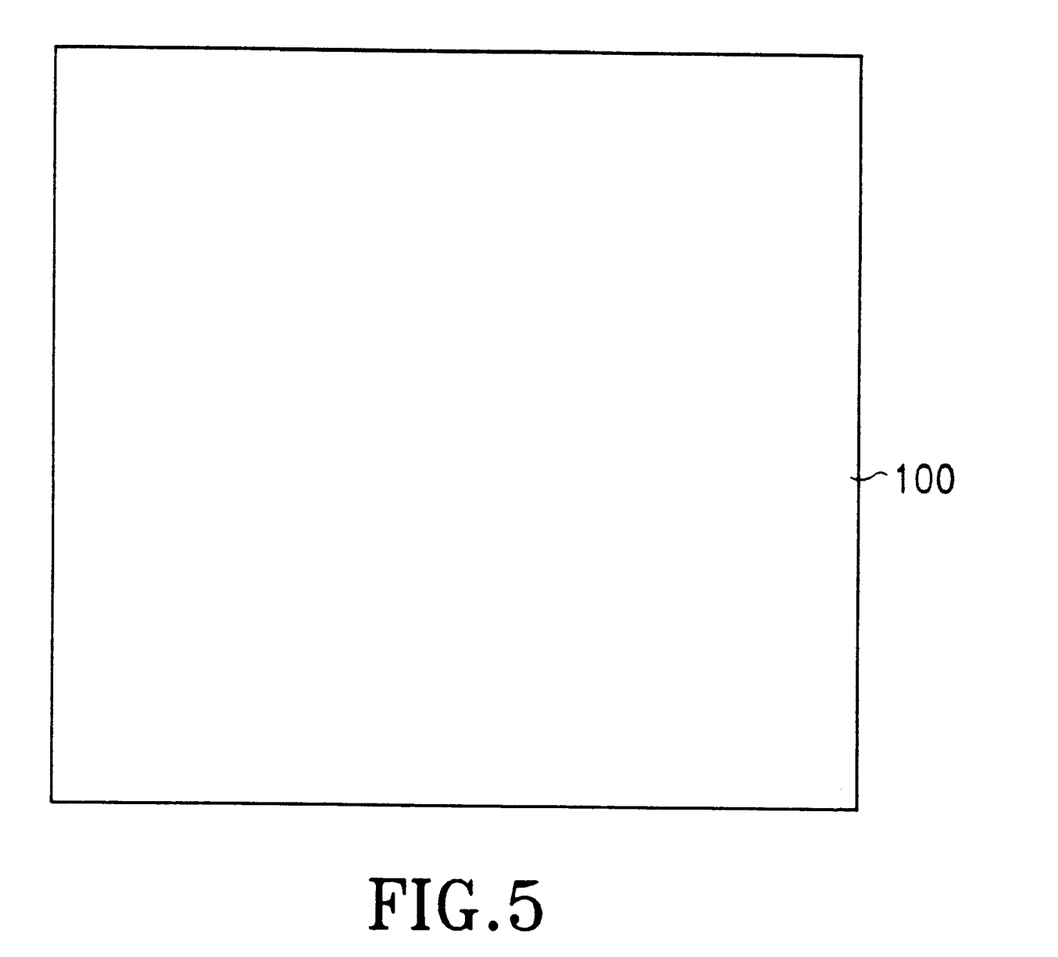
FIG. 5 is a schematic drawing illustrating the layout of an N well mask for defining the N well region according to the first embodiment.
Figure 6:
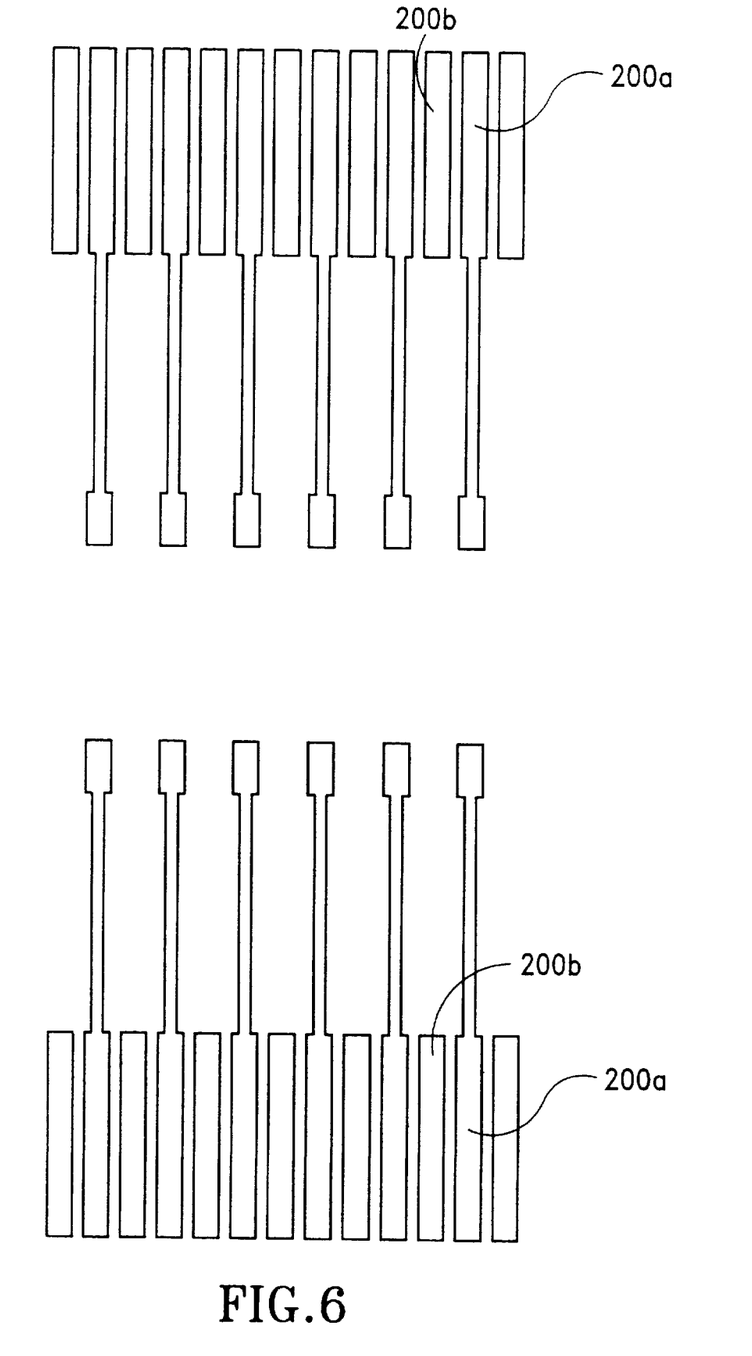
FIG. 6 is a schematic drawing illustrating the layout of a polysilicon mask according to the first embodiment.

FIG. 1A is a layout of the decoupling capacitor, FIG. 1B is a cross schematic drawing taken from the A–A' line in FIG. 1A. In FIG. 1A–1B, and FIG. 5, a P type wafer is used for the description of the present invention. A N well mask 100 for defining the N well region 4 in the wafer 2. As well known in the art, n type ions are implanted into the N well region 4 defined by the N well mask 100. Thus, the wafer 2 is divided into two areas, i.e. a N well (N conductive type) region 4 and a P conductive type region 6. Portion of a polysilicon mask 200 is formed over the N well mask 100 and the P conductive type region 6. The polysilicon mask is used to define a plurality of polisilicon gate 8a, 8b formed on the N well 4 and on the P conductive type region 6, respectively. The polysilicon mask includes a plurality of first stripe structures 200a and a plurality of second stripe structures 200b. The structures 200a, 200b are used to cover a polysilicon layer, thereby defining the polysilicon gate 8a, 8b via a lithography and an etching processes, as shown in FIG. 1A and FIG. 6. A portion of the first stripe structures 200a is formed over the N well 4 to define gates 8aof PMOS, others are formed over the P conductive type region 6 for defining the gates 8b of NMOS. Preferably, the first stripe structures 200a are longer than the second stripe structures 200b. The area of the first polysilicon layer used to serve as the gate is preferably narrow than other area. The first stripe structures 200a, and the second stripe structures 200b are formed reciprocally and the first stripe structures 200a are parallel to the second stripe structures 200b.

Figure 7:
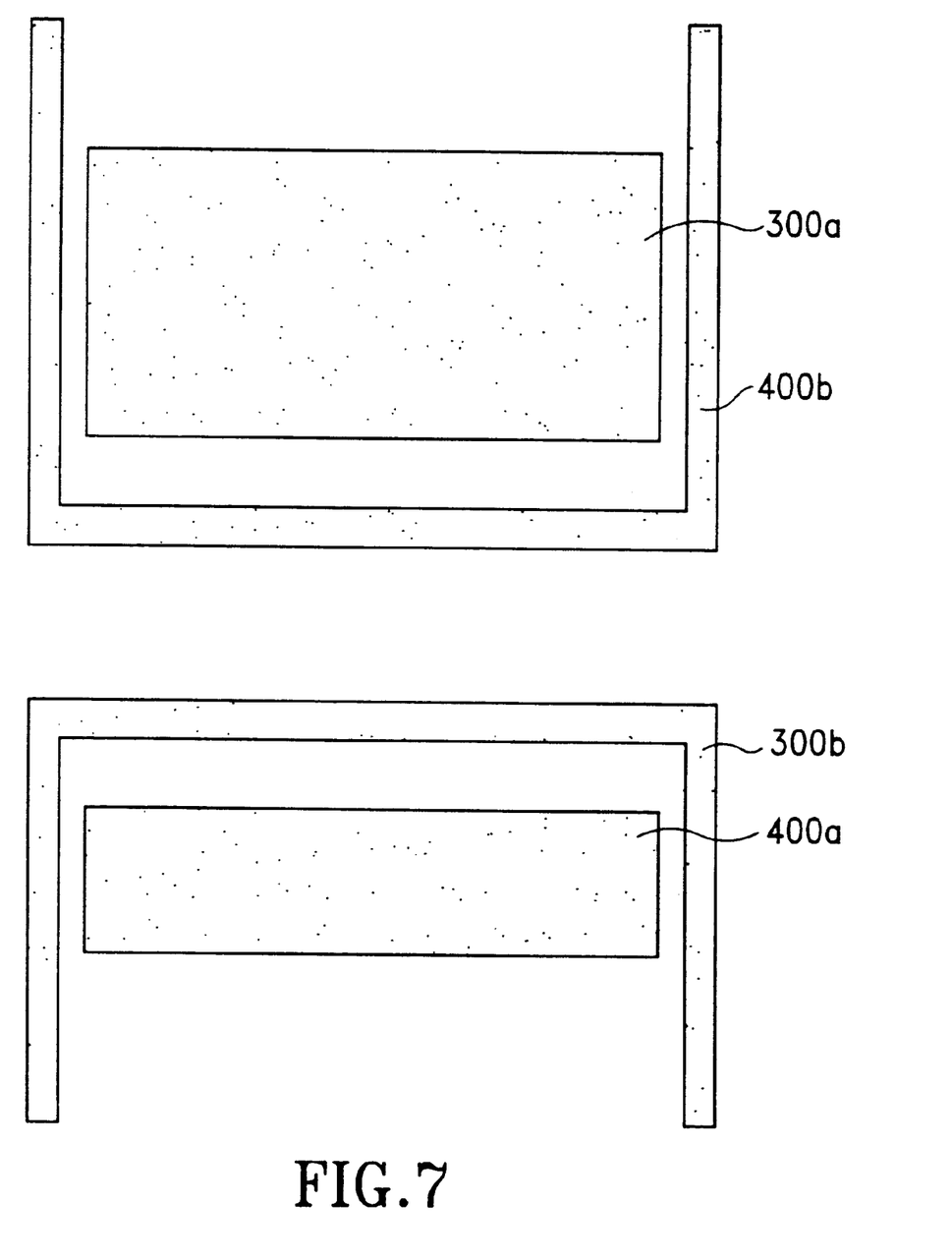
FIG. 7 is a schematic drawing illustrating the layout of a first and a second implanting masks according to the first embodiment.

Turning to FIGS. 1A–1B and FIG. 7, a first implanting mask over said first polysilicon mask for forming p type impurity region includes two portions 300a and 300b. The portion 300a of the first implanting mask exposes the area on the N well 4 adjacent to the polysilicon gate 8a. A p type impurity region of the PMOS can be generated by using the first implanting mask. The portion 300b exposes the area that surrounds the gate 8b of the NMOS to form a p type guard ring for NMOS. Alternatively, a second implanting mask formed over the first polysilicon gate for forming n type impurity region also includes two portions 400a and 400b. The portion 400a of the second implanting mask exposes the area on the P conductive type region 6 adjacent to the polysilicon gate 8B. Therefore, a n type impurity region of the NMOS can be generated by ion implantation using the second implanting mask. The portion 400b exposes the area that surrounds the gate 8a of the PMOS for forming PMOS's n type guard ring.

Figure 8:
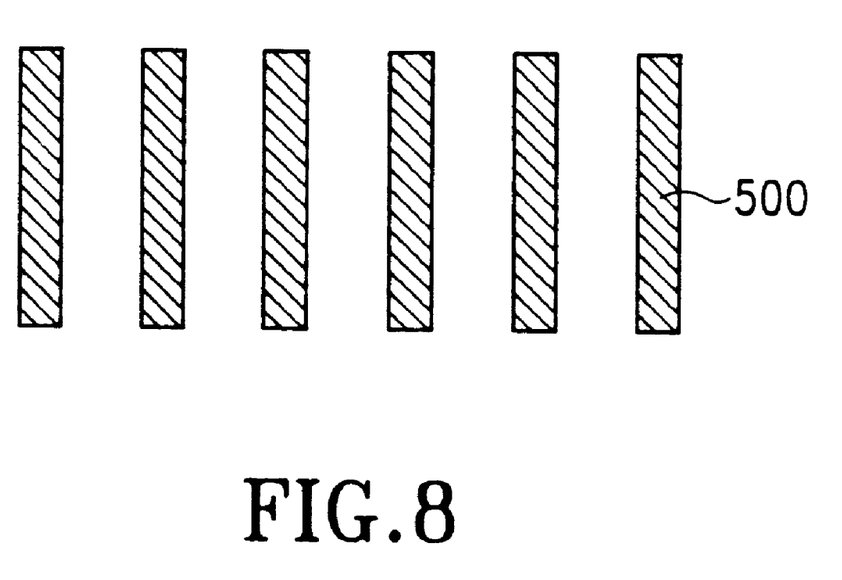
FIG. 8 is a schematic drawing illustrating the layout of a second polysilicon mask according to the first embodiment.

A second polysilicon mask 500 formed over the first implanting mask and the second implanting mask include a plurality of stripe structures for defining a second polysilicon layer that are formed between the gate 8a of PMOS and the gate 8b of NMOS. In detail, the defined second polysilicon layer 16 is formed between the polysilicon structures defined by the first stripe structures 200a formed on the N well 4 and the p type conductive region 6, respectively, as shown in FIG. 1A and FIG. 8. The second polysilicon mask can be replaced by a condcutive layer mask.

Figure 9:
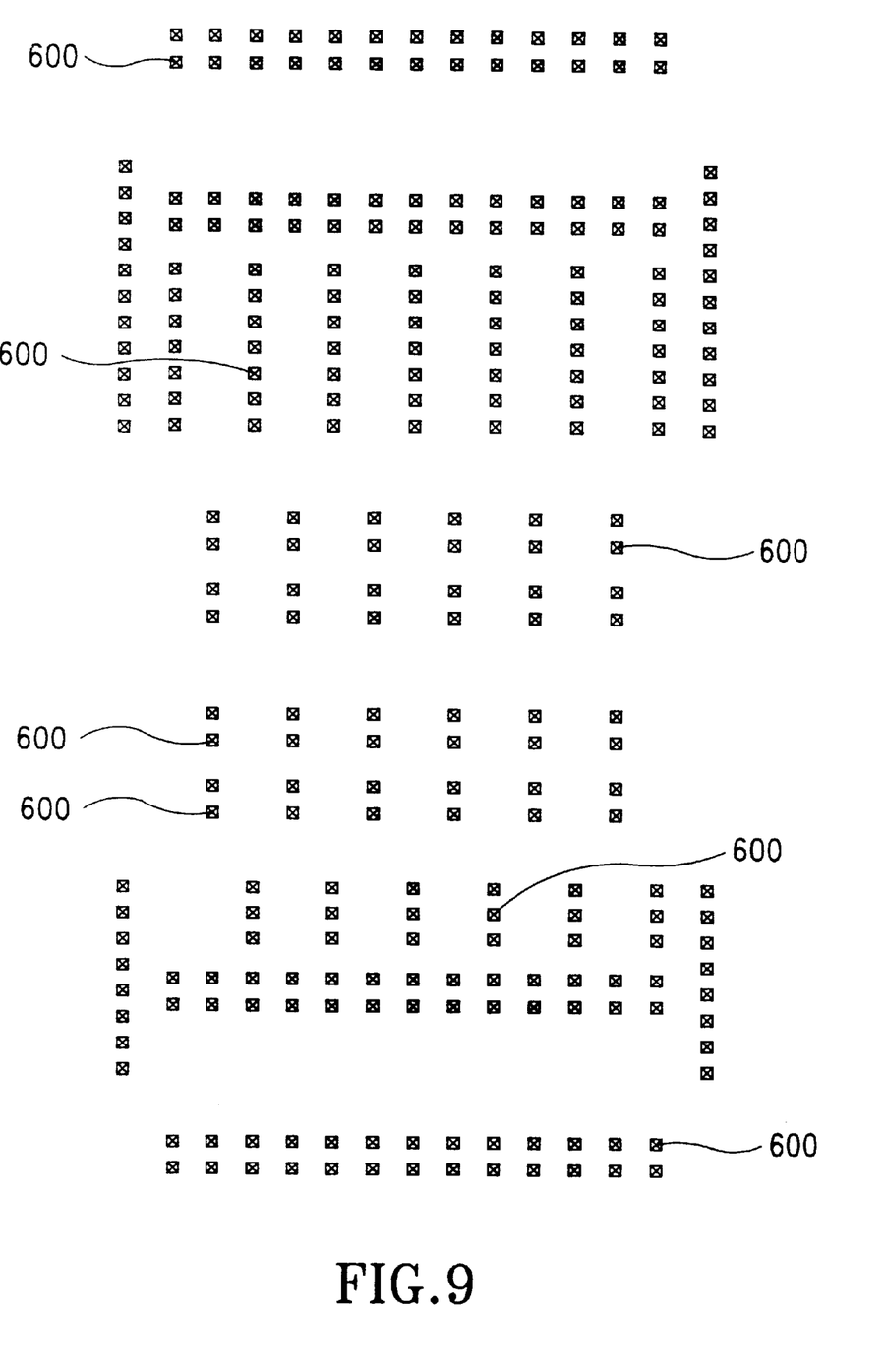
FIG. 9 is a schematic drawing illustrating the layout of a contact hole mask according to the first embodiment.
Figure 10:
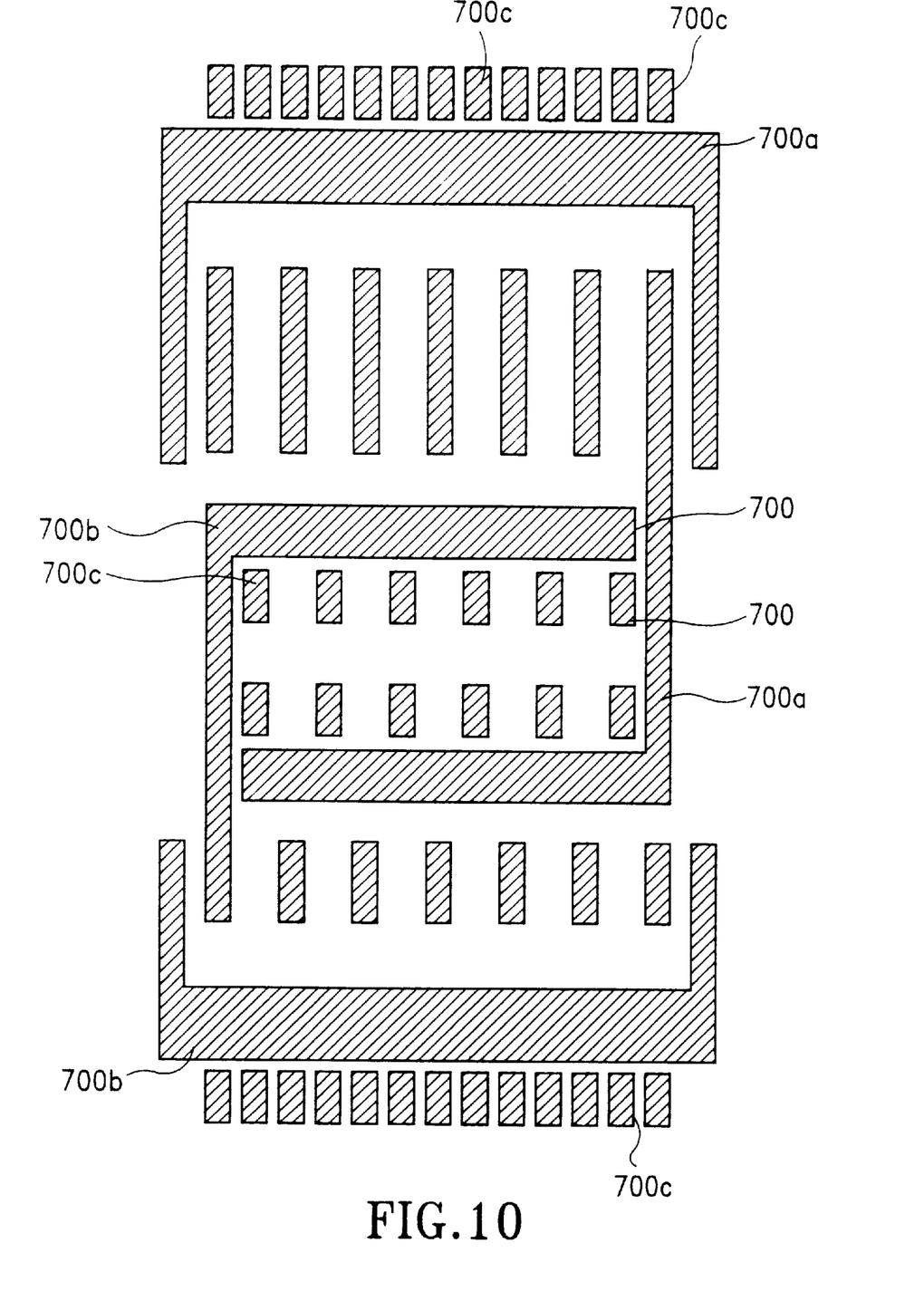
FIG. 10 is a schematic drawing illustrating the layout of a first and second metal line masks according to the first embodiment.

Turning to FIG. 1A and FIGS. 9, 10, a contact hole mask 600 formed over the second polysilicon mask 500 exposes portions of the first and second polysiicon layer, p type impurity region, the n type impurity region, the n type guard ring and the p type guard ring for forming contact holes. A metal mask is formed over the contact hole mask 600 to define the metal line for electrical connections. A first metal mask portion 700a define the metal layer to connect the n type guard ring, p type impurity region and the gate 8b on the p conductive type region as defined by the first stripe structures 200a. A second metal mask portion 700b defines the metal layer to connect the p type guard ring, n type impurity region and the gate 8a on the N well as defined by the first stripe structures 200a. Third portion metal mask portions covers a plurality of the polysilicon layer and the second polysilicon layer for connection. The metal layer defined by the first metal mask portion 700a is connected to the bias Vcc, while the metal layer defined by the second metal mask portion 700b is connected to ground.

Figure 2:
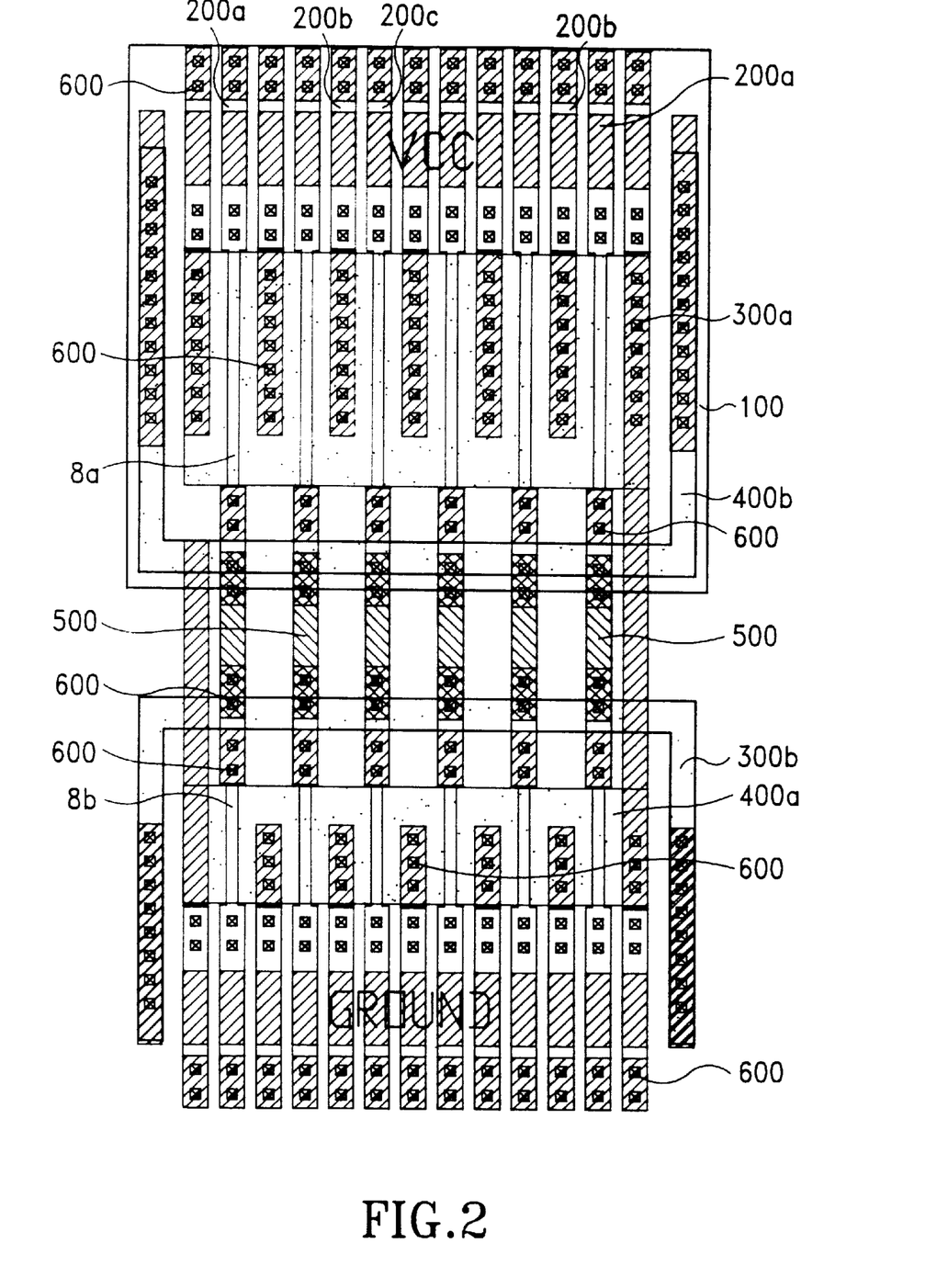
FIG. 2 is a schematic drawing illustrating the layout of a second embodiment in accordance with present invention.

A dummy decoupling capacitors can be used to replace a fault inverter. In effect, the dummy decoupling capacitor serves as a replacement inverter to replace a faulty inverter. As shown in FIG. 2, the metal layer between the polysilicon defined by the first stripe structures 200a and the polysilicon defined by the second stripe structures 200b need to be removed. Additionally, the metal layer between the polysilicon layer defined by first stripe structures 200a are also removed. The metal layer between the polysilicon layer defined by the second stripe structures 200b is removed. The portions of the metal layer formed between the gate and either the p type guard ring or n type guard ring are also removed. The polysilicon gates defined by the first stripe structures 200a are connected to the second polysilicon layer defined by the second polysilicon mask 500 via contact holes. Portions 200c of the first polysilicon layer are utilized to serve as the input terminal of the inverter. A portion of the first polysilicon on the N well defined by the second stripe structures 200b can be used as the output terminal of the inverter.

Figure 3:
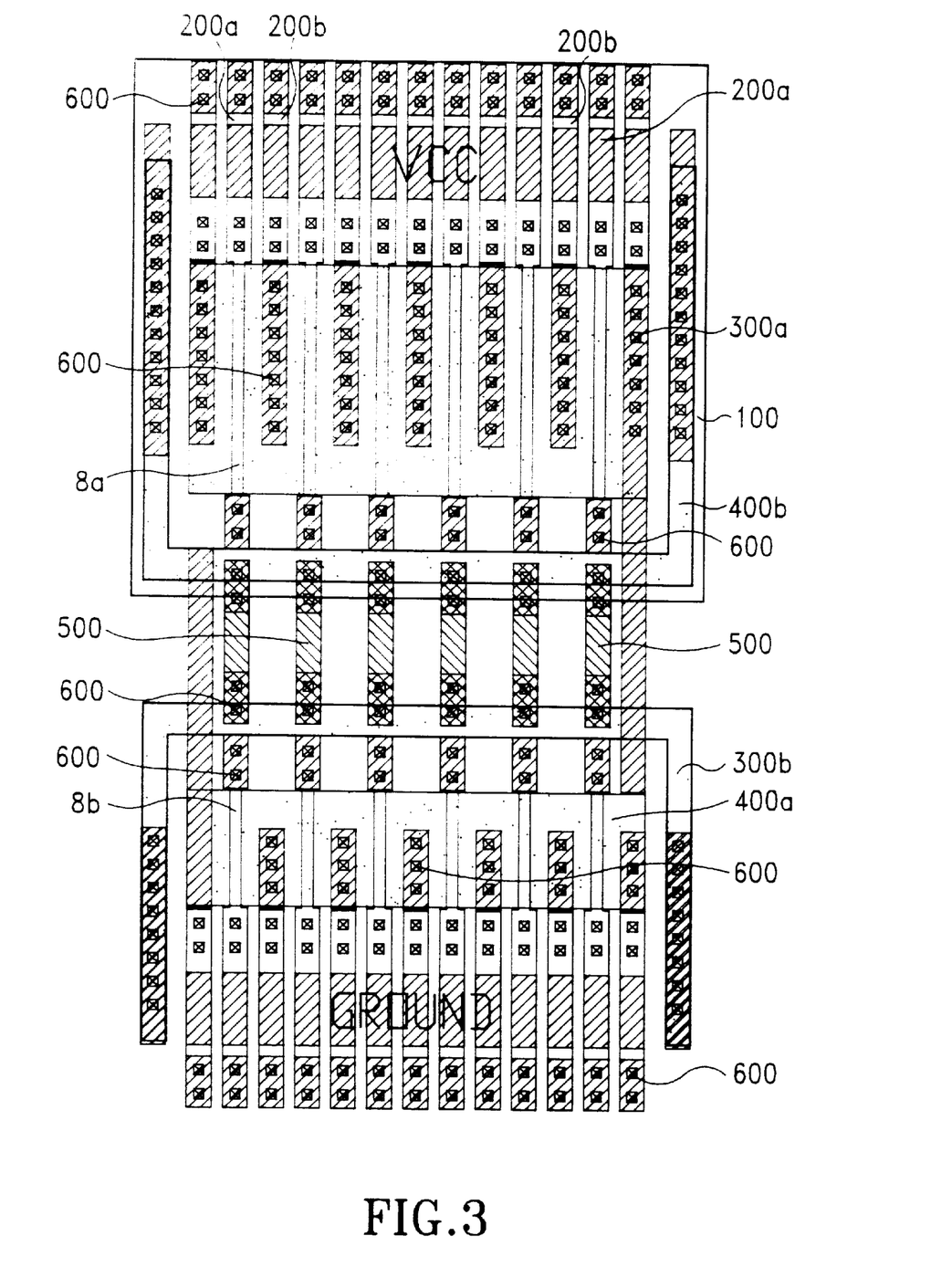
FIG. 3 is a schematic drawing illustrating the layout of a third embodiment in accordance with present invention.
Figure 4:
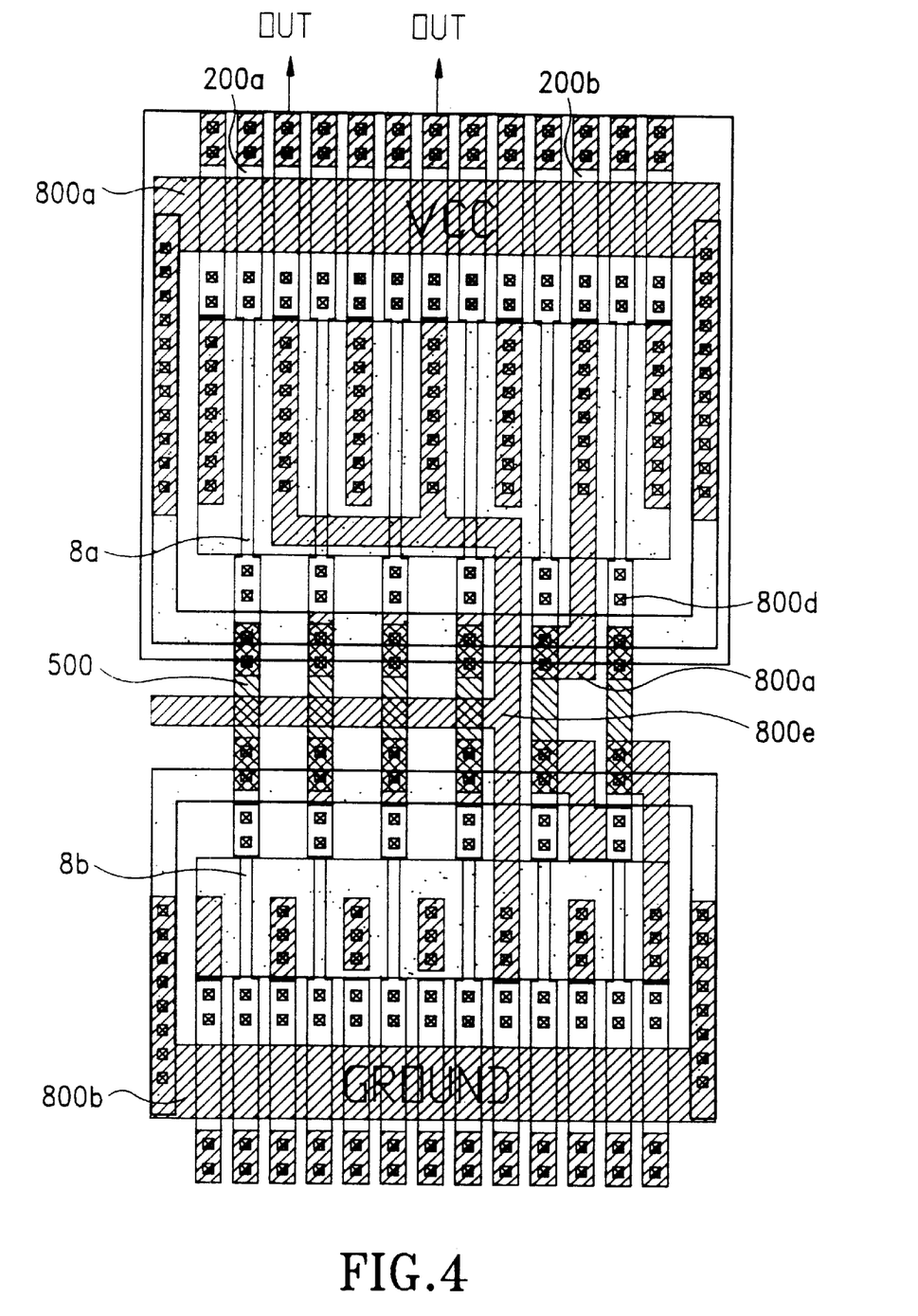
FIG. 4 is a schematic drawing illustrating the layout of a forth embodiment in accordance with present invention.

Turning to FIG. 3, if the metal layer between the first polysilicon layer defined by the stripe structures 200a and 200b are removed, then a PMOS and a NMOS are generated by separating aforesaid portions of the metal line. Turning to FIG. 4, another embodiment of the dummy decoulping capacitor of the present invention serves as a 3-input NAND gate. This structure is the same with the previous embodiments except for the metal mask. Metal lines are defined by the metal line mask. The metal line portion 800a connects the n type guard ring, a portion of the p type impurity region and a portion of the unused gate 8a on the N well defined by the first stripe structures 200a. The metal line portion 800b connects the p type guard ring, a portion of the n type impurity region and a portion of the unused gate 8b on the p conductive type region defined by the first stripe structures 200a. A portion of the first polysilicon defined by the second stripe structures 200b is connected to the gates 8b defined by the first stripe structures 200a using metal line portion 800c via portion of the second polysilicon layer defined by the second polysilicon mask 500. Alternatively, portion of the gates 8a defined by the first stripe structures 200a are connected to the first polysilicon layer 8b defined by the first stripe structures 200a using metal line portion 800d via portion of the second polysilicon layer defined by the second polysilicon mask 500. The decoupling capacitor can be used to serve as an electric circuit constructed by PMOS transistors and NMOS transistors including multi-input terminals logic gate, digital and analogic circuits.

The metal line portion 800e is used to connect the p type impurity region 300a defined by the second stripe structures 200b and the n type impurity regions 300b defined by the second stripe structures 200b. The portions 800e serves as the output terminal of the NAND gate. The metal line portion 800a defined by the metal mask is connected to the Vcc, the metal line portion 800b defined by the metal mask is connected to ground. Portions 200d of the gates 8a, 8b are utilized to serve as the first input terminal (in-1), the second input terminal (in-2), the third input terminal (in-3) or out terminal of the NAND gate, respectively.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A layout structure of decoupling capacitors formed on a semiconductor wafer, said layout structure comprising:

a well mask formed over a first portion of said wafer defining a first conductive type well in said wafer, said first well mask covering a second portion of said wafer;

a first polysilicon mask formed over said well mask including a plurality of first structures and a plurality of second structures to cover a first polysilicon layer, thereby defining polysilicon gates, a first portion of said first structures being formed over said first conductive type well to define gates of second conductive type MOS, a second portion of said first structures being formed over said second portion of said wafer to define gates of first conductive type MOS;

a first implanting mask formed over said first polysilicon mask for forming second conductive type region adjacent to said gate of said second conductive type MOS;

a second implanting mask over said first polysilicon mask for forming first conductive type region adjacent to said gate of said first conductive type MOS;

a second polysilicon mask for defining a second polysilicon layer that are formed between said gates of said second conductive type MOS and said gates of said first conductive type MOS; and a contact hole mask formed over said second polysilicon mask exposes portions of said first polysiicon layer, second conductive region, said first conductive type region and said second polysilicon layer for forming contact holes.

2. The layout structure of claim 1, wherein said layout structure comprising a metal mask over said contact hole mask to define a first metal line for electrical connection, wherein said metal mask including a first metal mask portion defining said metal layer to connect said second conductive type region, said gates of said second conductive type MOS and said gates of said first conductive type MOS, a second metal mask portion for connecting first conductive type region, said gates of said second conductive type MOS, wherein said first metal mask portion being connected to a bias Vcc, wherein said second metal mask portion being connected to ground.

3. The layout structure of claim 2, wherein said decoupling capacitor serves as an inverter by removing said first metal layer between said first, second stripe structures of the first polysiicon layer, and connecting said second polysilicon layer to said second conductive type MOS, and said first second conductive type MOS.

4. The layout structure of claim 2, wherein said decoupling capacitor serves as a PMOS transistor and a NMOS transistor by removing said first metal layer between said first, second stripe structures of the first polysiicon layer.

5. The layout structure of claim 1, wherein said layout structure comprising a metal mask over said contact hole mask to define a metal line for electrical connection, thereby serving as a 3-input NAND gate, wherein said metal mask defining said metal line connecting said second conductive type region, a portion of said gate of said first conductive type MOS, and defining said metal line connecting said first conductive type region, a portion of said gate of said second conductive type MOS, a portion of said first polysilicon defined by said second structures of said first polysilicon mask being connected to said gates of said second conductive type MOS via a first portion of said second polysilicon layer, portion of said gates of said first conductive type MOS being connected to said a portion first polysilicon layer defined by said second structures of said first polysilicon mask via a second portion of said second polysilicon layer.

6. The layout structure of claim 4, wherein said decoupling capacitor serves as an electric circuit constructed by PMOS transistors and NMOS transistors including multi-input terminals logic gate, digital and analogic circuits.

7. The layout structure of claim 1, wherein said second polysilicon mask can be replaced by a condcutive layer mask.

* * * * *